(12) United States Patent
Cai et al.

(10) Patent No.: US 11,557,445 B2
(45) Date of Patent: Jan. 17, 2023

(54) KEYBOARD DEVICE

(71) Applicant: Primax Electronics Ltd., Taipei (TW)

(72) Inventors: Liu-Bing Cai, Taipei (TW); Rui-Qing Xiao, Taipei (TW); Xiao-Ping Wang, Taipei (TW); Jin-Chun Zhang, Taipei (TW)

(73) Assignee: Primax Electronics Ltd., Taipei (TW)

( * ) Notice: Subject to any disclaimer, the term of this patent is extended or adjusted under 35 U.S.C. 154(b) by 170 days.

(21) Appl. No.: 17/136,988

(22) Filed: Dec. 29, 2020

(65) Prior Publication Data

US 2022/0165520 A1 May 26, 2022

(30) Foreign Application Priority Data

Nov. 20, 2020 (CN) .......................... 202011310020.0

(51) Int. Cl.
*G06F 3/02* (2006.01)
*H01H 13/81* (2006.01)
*H05K 1/18* (2006.01)

(52) U.S. Cl.
CPC ........... *H01H 13/81* (2013.01); *G06F 3/0202* (2013.01); *H05K 1/189* (2013.01)

(58) Field of Classification Search
CPC .......... H01H 13/81; G06G 3/02; H05K 1/189; G09G 5/00; G06F 3/04; G06F 21/83; G06F 1/16; G06F 15/02; G06F 3/02
See application file for complete search history.

(56) References Cited

U.S. PATENT DOCUMENTS

| | | | | |
|---|---|---|---|---|
| 5,788,386 | A * | 8/1998 | Hayashi | G06F 3/0216 400/489 |
| 6,039,478 | A * | 3/2000 | Chou | G06F 3/0219 400/472 |
| 11,216,078 | B2 * | 1/2022 | Shipman | G06F 3/0238 |
| 2001/0002166 | A1 * | 5/2001 | Katrinecz, Jr. | H01H 13/70 362/85 |
| 2006/0275069 | A1 * | 12/2006 | Jones | G06F 3/0216 400/490 |
| 2011/0175811 | A1 * | 7/2011 | Edmister | G06F 3/021 345/161 |

* cited by examiner

*Primary Examiner* — Pegeman Karimi
(74) *Attorney, Agent, or Firm* — Kirton McConkie; Evan R. Witt

(57) ABSTRACT

A keyboard device includes a bottom cover, a supporting plate, a flexible circuit board and plural key structures. The supporting plate is installed on the bottom cover. The supporting plate has a curved arc-shaped profile that is bent upwardly in a direction away from the bottom cover. The supporting plate includes plural perforations. The flexible circuit board is arranged between the bottom cover and the supporting plate. The plural key structures are installed on the supporting plate. The plural key structures are penetrated through the corresponding perforations and contacted with the flexible circuit board.

8 Claims, 4 Drawing Sheets

KEYBOARD DEVICE

FIELD OF THE INVENTION

The present invention relates to an input device, and more particularly to an ergonomic keyboard device.

BACKGROUND OF THE INVENTION

With increasing development of science and technology, a variety of electronic devices are designed in views of convenience and user-friendliness. For helping the user well operate the electronic devices, the electronic devices are gradually developed in views of humanization. The input devices of the common electronic devices include for example mouse devices, keyboard devices, trackball devices, or the like. Via the keyboard device, characters or symbols can be inputted into the computer system directly. As a consequence, most users and most manufacturers of input devices pay much attention to the development of keyboard devices.

Nowadays, most computer users often use the computers for a long time because of working, leisure or entertainment purposes. Consequently, the comfort of using the keyboard device is an important factor influencing the health of computer user. Generally, the computer user often gets repetitive stress injury (RSI) because the posture of using the keyboard device is not proper. When a conventional standard keyboard device is used to type, the wrist joints may bend at an angle and the fingers cannot be stretched naturally. That is, the posture is not good. If the keyboard device has been used for a long time, it is easy to cause damage to the user's wrists, fingers, hand joints and shoulders. In order to prevent the computer users from getting repetitive stress injuries because of poor postures when using computers for a long time, keyboard devices designed according to ergonomics consideration have been introduced into the market.

In a conventional ergonomic keyboard, the main key area is divided into two sub-key areas from a middle region. That is, the two sub-key areas include a left sub-key area and a right sub-key area. There is an included angle between the adjacent edges of the left sub-key area and the right sub-key area. Moreover, there is an included angle between each sub-key region and a keyboard base. In other words, the two sub-key areas are inclined to the keyboard base to form a mountain-shaped structure. Due to this structural design, the two hands of the user can be placed on the keyboard device at the natural tilt angle. Since the hands of the user are naturally placed on the keyboard device, the possibility of causing injuries of the user will be reduced.

Regardless of a standard keyboard device or an ergonomic keyboard device, plural keys are installed on a flat metal supporting plate according to the structure of the keyboard device. However, the ergonomic keyboard device is equipped with additional mechanisms to install the plural keys on the flat metal supporting plate. Consequently, the two sub-key areas can be inclined to the keyboard base to form a mountain-shaped structure. In other words, the fabricating cost of the ergonomic keyboard device is largely increased.

Therefore, there is a need of providing an improved keyboard device in order to overcome the drawbacks of the conventional technologies.

SUMMARY OF THE INVENTION

An object of the present invention provides a keyboard device with plural key structures and a supporting plate. The plural key structures are installed on the supporting plate with a curved arc profile. These key structures are arranged along the curved arc profile to meet the ergonomic demands.

The other objects and advantages of the present invention will be understood from the disclosed technical features.

In accordance with an aspect of the present invention, a keyboard device is provided. The keyboard device includes a bottom cover, a supporting plate, a flexible circuit board and plural key structures. The supporting plate is installed on the bottom cover. The supporting plate has a curved arc-shaped profile that is bent upwardly in a direction away from the bottom cover. The supporting plate includes plural perforations. The flexible circuit board is arranged between the bottom cover and the supporting plate. The plural key structures are installed on the supporting plate. The plural key structures are penetrated through the corresponding perforations and contacted with the flexible circuit board.

In an embodiment, the supporting plate includes a curved portion, a first inclined portion and a second inclined portion. The curved portion has the curved arc-shaped profile. The first inclined portion is extended from a first end of the curved portion and inclined toward the bottom cover according to the curved arc-shaped profile of the curved portion. The second inclined portion is extended from a second end of the curved portion and inclined toward the bottom cover according to the curved arc-shaped profile of the curved portion.

In an embodiment, the plural perforations of the supporting plate are distributed in the first inclined portion and the second inclined portion.

In an embodiment, the plural key structures are classified into first-portion key structures and second-portion key structures. The first-portion key structures are installed on the first inclined portion of the supporting plate. The second-portion key structures are installed on the second inclined portion of the supporting plate.

In an embodiment, the supporting plate is made of metallic material.

In an embodiment, after the plural key structures are penetrated through the corresponding perforations and contacted with the flexible circuit board, the flexible circuit board is subjected to deformation according to the curved arc-shaped profile of the supporting plate.

In an embodiment, each key structure includes a keycap and a keyswitch. The keycap and the keyswitch are assembled with each other. The keycap is located over the supporting plate. After the keyswitch is penetrated through the corresponding perforation, the keyswitch is installed on the supporting plate and contacted with the flexible circuit board.

In an embodiment, the keyswitch includes a contacting part, a first electric connection part and a second electric connection part. The contacting part is arranged between the keycap and the supporting plate. The first electric connection part and the second electric connection part are arranged between the flexible circuit board and the supporting plate. The contacting part is contacted with the supporting plate. The first electric connection part and the second electric connection part are electrically connected with the flexible circuit board.

In an embodiment, the keyswitch further includes a positioning post, and the flexible circuit board includes plural positioning holes. The positioning post is penetrated through the corresponding positioning hole of the flexible circuit board, so that the keyswitch is positioned on the flexible circuit board.

In an embodiment, after the positioning post of the keyswitch is penetrated through the corresponding positioning hole of the flexible circuit board, a portion of the positioning post is exposed outside the corresponding positioning hole. The keyboard device further includes a soldering material, and the soldering material is formed on a portion of the flexible circuit board. The portion of the positioning post exposed outside the positioning hole is covered by the soldering material. Consequently, the keyswitch is fixed on the flexible circuit board.

From the above descriptions, the present invention provides the keyboard device. The plural key structures are installed on the supporting plate with a curved arc profile. These key structures are arranged along the curved arc profile to meet the ergonomic demands. That is, it is not necessary to provide an additional mechanism to adjust the arrangements and the positions of these key structures. Since the process of fabricating the keyboard device with the ergonomic configuration is simplified, the fabricating cost is reduced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
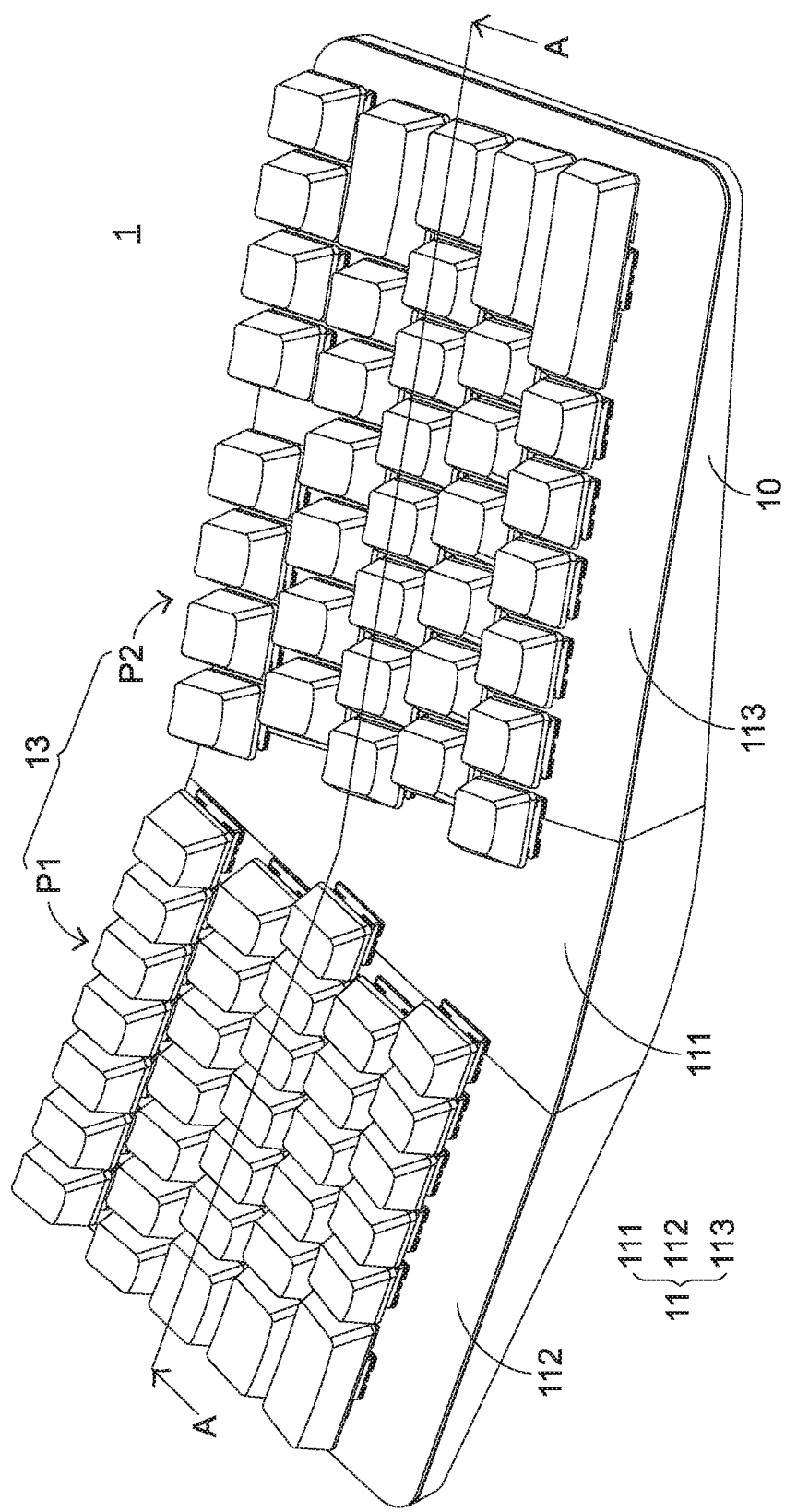
FIG. 1 is a schematic perspective view illustrating the outer appearance of a keyboard device according to an embodiment of the present invention.
Figure 2:
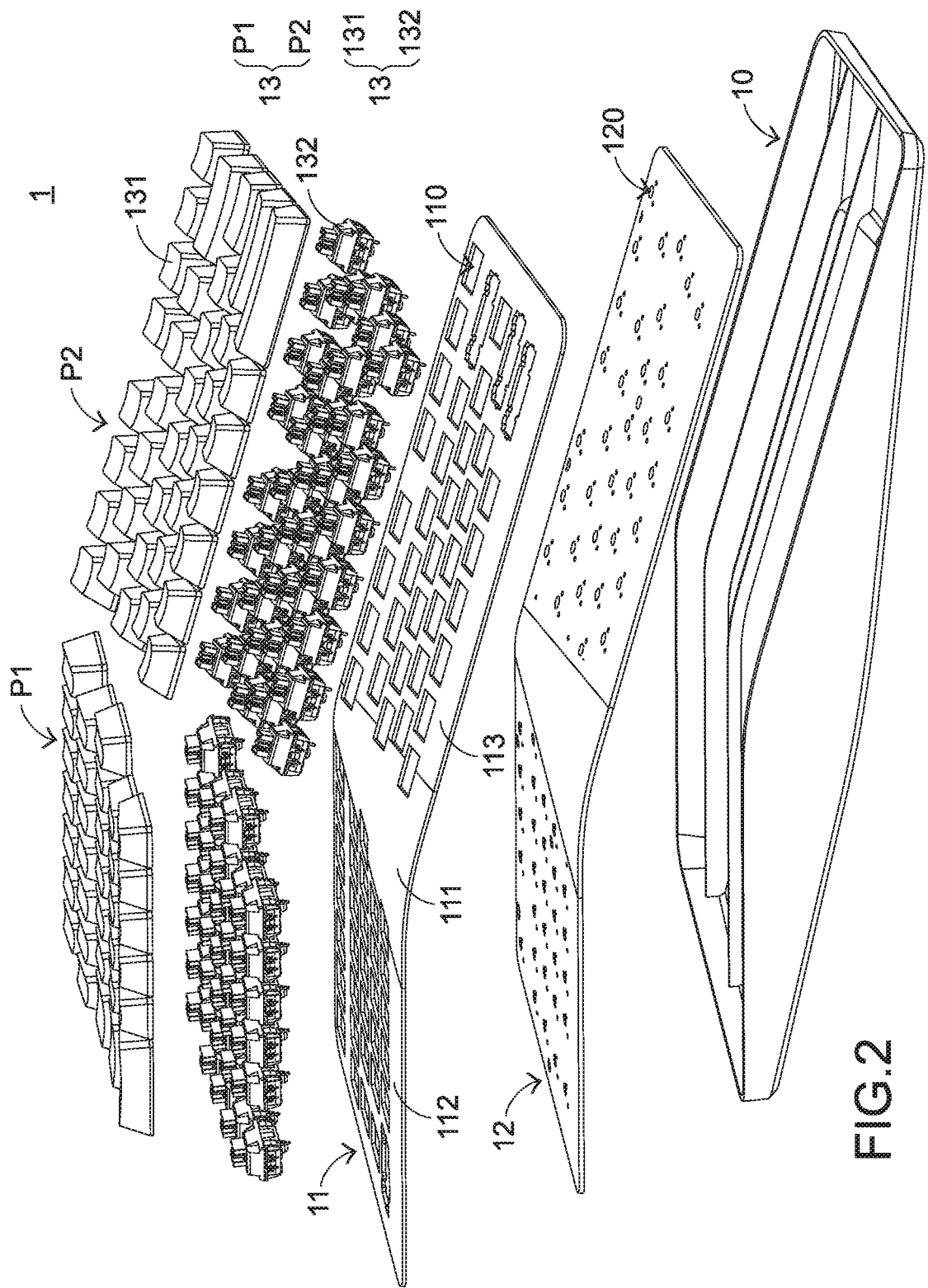
FIG. 2 is a schematic exploded view illustrating the keyboard device as shown in FIG. 1.
Figure 3:
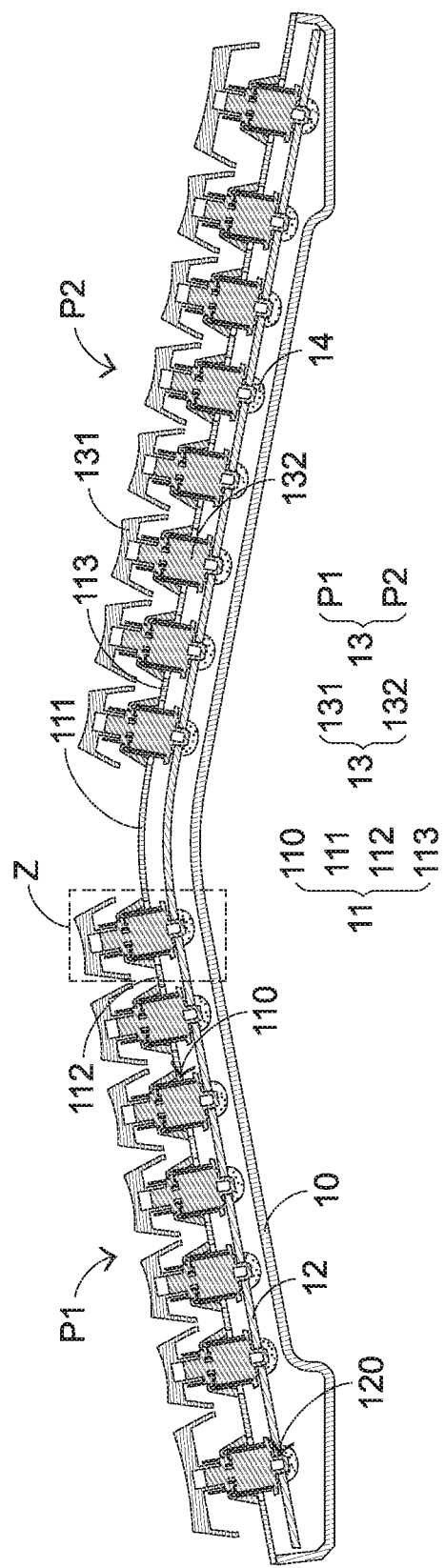
FIG. 3 is a schematic cross-sectional view illustrating the keyboard device as shown in FIG. 1 and taken along the line AA.
Figure 4:
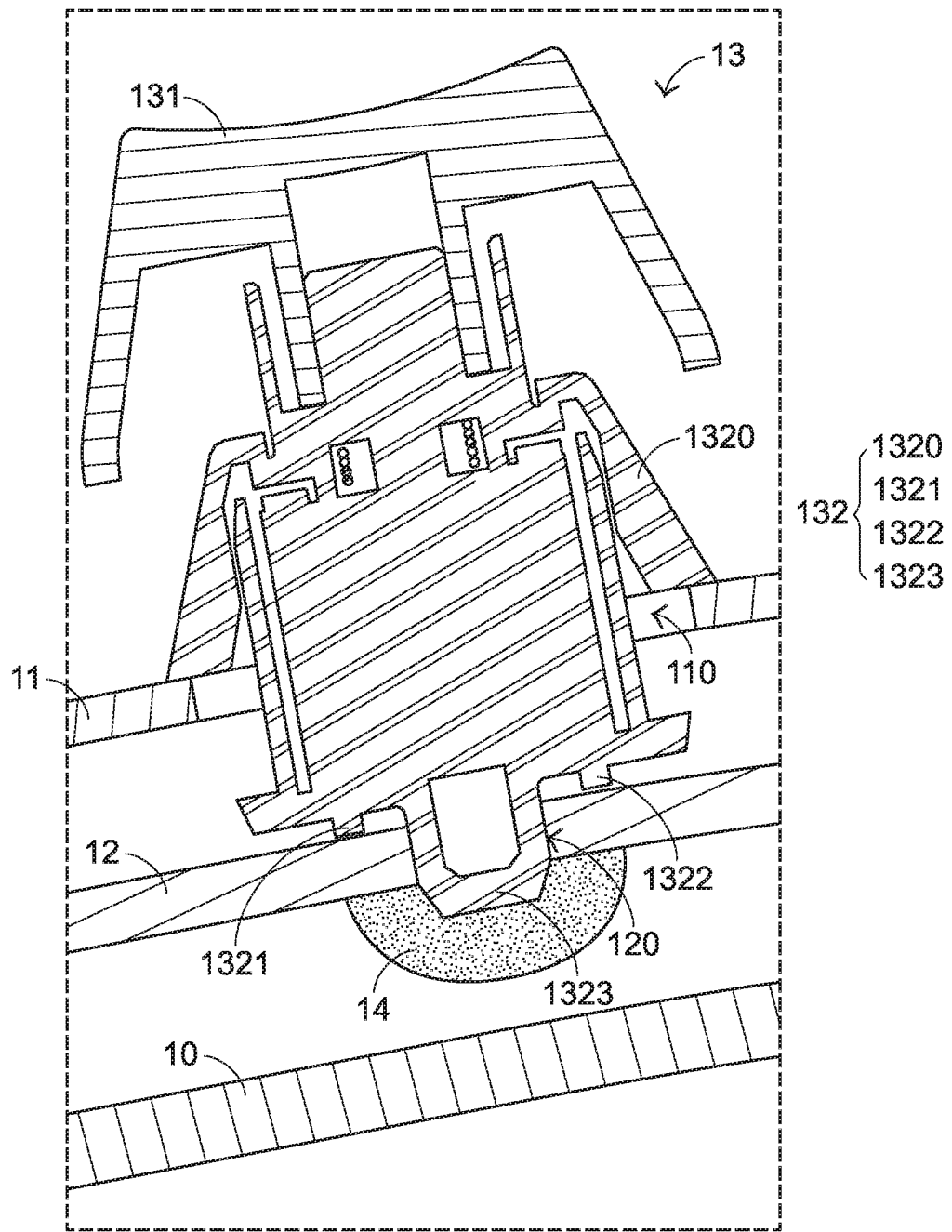
FIG. 4 is a schematic enlarged view illustrating the region Z as shown in FIG. 3.

Please refer to FIGS. 1, 2, 3 and 4. FIG. 1 is a schematic perspective view illustrating the outer appearance of a keyboard device according to an embodiment of the present invention. FIG. 2 is a schematic exploded view illustrating the keyboard device as shown in FIG. 1. FIG. 3 is a schematic cross-sectional view illustrating the keyboard device as shown in FIG. 1 and taken along the line AA. FIG. 4 is a schematic enlarged view illustrating the region Z as shown in FIG. 3.

As shown in FIGS. 1, 2, 3 and 4, the keyboard device 1 comprises a bottom cover 10, a supporting plate 11, a flexible circuit board 12 and plural key structures 13. The supporting plate 11 is installed on the bottom cover 10. The supporting plate 11 has a curved arc-shaped profile that is bent upwardly in the direction away from the bottom cover 10. Moreover, the supporting plate 11 comprises plural perforations 110. The flexible circuit board 12 is arranged between the bottom cover 10 and the supporting plate 11. The plural key structures 13 are installed on the supporting plate 11. The key structures 13 are penetrated through the corresponding perforations 110 and contacted with the flexible circuit board 12.

Preferably but not exclusively, the supporting plate 11 is made of metallic material. Moreover, when the supporting plate 11 and the bottom cover 10 are combined with each other, an accommodation space is formed between the supporting plate 11 and the bottom cover 10. The flexible circuit board 12 is disposed within the accommodation space. These key structures 13 are classified into some types, e.g., ordinary keys, numeric keys and function keys. When one of the key structures 13 is depressed by the user's finger, the keyboard device 1 generates a corresponding key signal to a computer, and thus the computer executes a corresponding function. For example, when an ordinary key is depressed, a corresponding English letter or symbol is inputted into the computer. When a numeric key is depressed, a corresponding number is inputted into the computer. In addition, the function keys (F1~F12) can be programmed to provide various quick access functions.

The structure of the keyboard device 1 will be described in more details as follows.

Please refer to FIGS. 1, 2, 3 and 4 again. In an embodiment, the supporting plate 11 comprises a curved portion 111, a first inclined portion 112 and a second inclined portion 113. The first inclined portion 112 is extended from a first end of the curved portion 111 and inclined toward the bottom cover 10. That is, the first inclined portion 112 is inclined downwardly according to the curved arc-shaped profile and the bending direction of the curved portion 111. The second inclined portion 113 is extended from a second end of the curved portion 111 and inclined toward the bottom cover 10. That is, the second inclined portion 113 is also inclined downwardly according to the curved arc-shaped profile and the bending direction of the curved portion 111. The second end and the first end of the curved portion 111 are opposed to each other. The curved portion 111, the first inclined portion 112 and the second inclined portion 113 are collaboratively formed as a roof-like or mountain-shaped profile. In other words, the plural key structures 13 are installed on the supporting plate 11 in a roof-like or mountain-shaped arrangement according to the above curved arc-shaped profile and bending direction.

Please refer to FIGS. 1, 2, 3 and 4 again. In this embodiment, the perforations 110 of the supporting plate 11 are distributed in the first inclined portion 112 and the second inclined portion 113. These key structures 13 are classified into first-portion key structures P1 and second-portion key structures P2. After the first-portion key structures P1 are penetrated through the corresponding perforations 110 (i.e., the perforations 110 in the first inclined portion 112), the first-portion key structures P1 are installed on the supporting plate 11 and contacted with the flexible circuit board 12. After the second-portion key structures P2 are penetrated through the corresponding perforations 110 (i.e., the perforations 110 in the second inclined portion 113), the second-portion key structures P2 are installed on the supporting plate 11 and contacted with the flexible circuit board 12.

Please refer to FIGS. 1, 2, 3 and 4 again. In an embodiment, each key structure 13 comprises a keycap 131 and a keyswitch 132. The keycap 131 and the keyswitch 132 are assembled with each other. The keycap 131 is located over the supporting plate 11. After the keyswitch 132 of each key structure 13 is penetrated through the corresponding perforation 110, the key structure 13 is installed on the supporting plate 11 and contacted with the flexible circuit board 12. Moreover, the keyswitch 132 comprises a contacting part 1320, a first electric connection part 1321 and a second electric connection part 1322. The contacting part 1320 is arranged between the keycap 131 and the supporting plate 11. The first electric connection part 1321 and the second electric connection part 1322 are arranged between the flexible circuit board 12 and the supporting plate 11. When the keyswitch 132 of each key structure 13 is penetrated through the corresponding perforation 110 and the key structure 13 is installed on the supporting plate 11 and contacted with the flexible circuit board 12, the contacting part 1320 of the keyswitch 132 is contacted with the surface of the supporting plate 11. In such way, each key structure 13 can be installed on the supporting plate 11, and the first electric connection part 1321 and the second electric connection part 1322 are electrically connected with a corresponding electrode (not shown) flexible circuit board 12. Consequently, the electric connection between the key structure 13 and the flexible circuit board 12 is established.

In an embodiment, the keyswitch 132 of each key structure 13 further comprises a positioning post 1323, and the flexible circuit board 12 comprises plural positioning holes 120. When the keyswitch 132 of each key structure 13 is penetrated through the corresponding perforation 110 and the key structure 13 is installed on the supporting plate 11 and contacted with the flexible circuit board 12, the positioning post 1323 is penetrated through the corresponding positioning hole 120 of the flexible circuit board 12. Consequently, the keyswitch 132 is positioned on the flexible circuit board 12.

In an embodiment, the keyboard device 1 further comprises a soldering material 14. After the positioning post 1323 of each keyswitch 132 is penetrated through the corresponding positioning hole 120 of the flexible circuit board 12, a portion of the positioning post 1323 is exposed outside the corresponding positioning hole 120. The soldering material 14 is formed on a portion of the flexible circuit board 12, and the portion of the positioning post 1323 exposed outside the positioning hole 120 is covered by the soldering material 14. Consequently, the keyswitch 132 is fixed on the flexible circuit board 12. In this embodiment, the keyswitch 132 is fixed on the flexible circuit board 12 through a welding means. It is noted that the method of fixing the keyswitch 132 on the flexible circuit board 12 is not restricted. In some other embodiments, the soldering material 14 is omitted, and the keyswitch 132 is fixed on the flexible circuit board 12 through a non-welding means. For example, the positioning post 1323 of the keyswitch 132 is interference-fitted into the corresponding positioning hole 120 of the flexible circuit board 12 to achieve the fixing purpose.

As mentioned above, the keyboard device 1 is equipped with the flexible circuit board 12. After the plural key structures 13 are penetrated through the corresponding perforations, the plural key structures 13 are installed on the supporting plate 11 and contacted with the flexible circuit board 12. Especially, after the keyswitch 132 of each key structure 13 is penetrated through the corresponding positioning hole 120 of the flexible circuit board 12, the flexible circuit board 12 is subjected to deformation according to the curved arc-shaped profile of the supporting plate 11. That is, the flexible circuit board 12 also has a curved arc-shaped profile that is bent upwardly in the direction away from the bottom cover 10. If a rigid circuit board is used to replace the flexible circuit board, the key structures 13 on the curved arc-shaped supporting plate 11 are electrically connected with the rigid circuit board through a more complicated mechanism. In other words, the use of the flexible circuit board 12 in the keyboard device 1 is advantageous over the rigid circuit board.

In an embodiment, the keyswitch 132 comprises an upper housing and a lower housing, and a receiving space is defined between the upper housing and the lower housing. An operating shaft and a spring are disposed within the receiving space. While the key structure 13 is pressed down, the operating shaft is correspondingly moved downwardly. The spring is sheathed around the operating shaft. In response to the elastic force of the spring, the operating shaft can be returned to its original position. The associated components of the keyswitch are well known to those skilled in the art, and not redundantly described herein.

In the above embodiment, the supporting plate 11 is a combination of the curved portion 111, the first inclined portion 112 and the second inclined portion 113. It is noted that numerous modifications and alterations may be made while retaining the teachings of the invention. For example, in another embodiment, the entire of the supporting plate 11 is a curved plate structure.

From the above descriptions, the present invention provides the keyboard device. The plural key structures are installed on the supporting plate with a curved arc profile. These key structures are arranged along the curved arc profile to meet the ergonomic demands. That is, it is not necessary to provide an additional mechanism to adjust the arrangements and the positions of these key structures. Since the process of fabricating the keyboard device with the ergonomic configuration is simplified, the fabricating cost is reduced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A keyboard device, comprising:
    a bottom cover;
    a supporting plate installed on the bottom cover, wherein the supporting plate has a curved arc-shaped profile that is bent upwardly in a direction away from the bottom cover, and the supporting plate comprises plural perforations;
    a flexible circuit board arranged between the bottom cover and the supporting plate; and
    plural key structures installed on the supporting plate, wherein the plural key structures are penetrated through the corresponding perforations and contacted with the flexible circuit board,
    wherein each key structure comprises a keycap and a keyswitch, wherein the keycap and the keyswitch are assembled with each other, and the keycap is located over the supporting plate, wherein after the keyswitch is penetrated through the corresponding perforation, the keyswitch is installed on the supporting plate and contacted with the flexible circuit board,
    wherein the keyswitch comprises a contacting part, a first electric connection part and a second electric connection part, wherein the contacting part is arranged between the keycap and the supporting plate, and the first electric connection part and the second electric connection part are arranged between the flexible circuit board and the supporting plate, wherein the contacting part is contacted with the supporting plate, and the first electric connection part and the second electric connection part are electrically connected with the flexible circuit board.

2. The keyboard device according to claim 1, wherein the supporting plate comprises a curved portion, a first inclined portion and a second inclined portion, wherein the curved portion has the curved arc-shaped profile, the first inclined portion is extended from a first end of the curved portion and inclined toward the bottom cover according to the curved arc-shaped profile of the curved portion, and the second inclined portion is extended from a second end of the curved portion and inclined toward the bottom cover according to the curved arc-shaped profile of the curved portion, wherein the first end and the second end are opposed to each other.

3. The keyboard device according to claim 2, wherein the plural perforations of the supporting plate are distributed in the first inclined portion and the second inclined portion.

4. The keyboard device according to claim 2, wherein the plural key structures are classified into first-portion key structures and second-portion key structures, wherein the first-portion key structures are installed on the first inclined portion of the supporting plate, and the second-portion key structures are installed on the second inclined portion of the supporting plate.

5. The keyboard device according to claim 1, wherein the supporting plate is made of metallic material.

6. The keyboard device according to claim 1, wherein after the plural key structures are penetrated through the corresponding perforations and contacted with the flexible circuit board, the flexible circuit board is subjected to deformation according to the curved arc-shaped profile of the supporting plate.

7. The keyboard device according to claim 1, wherein the keyswitch further comprises a positioning post, and the flexible circuit board comprises plural positioning holes, wherein the positioning post is penetrated through the corresponding positioning hole of the flexible circuit board, so that the keyswitch is positioned on the flexible circuit board.

8. The keyboard device according to claim 7, wherein after the positioning post of the keyswitch is penetrated through the corresponding positioning hole of the flexible circuit board, a portion of the positioning post is exposed outside the corresponding positioning hole, wherein the keyboard device further comprises a soldering material, and the soldering material is formed on the flexible circuit board, wherein the portion of the positioning post exposed outside the positioning hole is covered by the soldering material, so that the keyswitch is fixed on the flexible circuit board.

\* \* \* \* \*